(12) United States Patent
Jung et al.

(10) Patent No.: US 10,992,437 B2
(45) Date of Patent: *Apr. 27, 2021

(54) METHOD AND APPARATUS FOR RECEIVING REFERENCE SIGNALS IN SUPPORT OF FLEXIBLE RADIO COMMUNICATION

(71) Applicant: Motorola Mobility LLC, Chicago, IL (US)

(72) Inventors: Hyejung Jung, Palatine, IL (US); Vijay Nangia, Woodridge, IL (US); Ravikiran Nory, Buffalo Grove, IL (US); Ziad Ahmad, Chicago, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/716,463

(22) Filed: Dec. 16, 2019

(65) Prior Publication Data

US 2020/0119878 A1   Apr. 16, 2020

Related U.S. Application Data

(63) Continuation of application No. 15/674,490, filed on Aug. 10, 2017, now Pat. No. 10,530,544.
(Continued)

(51) Int. Cl.
*H04L 5/00* (2006.01)
*H04W 36/00* (2009.01)
(Continued)

(52) U.S. Cl.
CPC ........... *H04L 5/0048* (2013.01); *H04H 60/43* (2013.01); *H04L 5/0092* (2013.01); *H04L 7/10* (2013.01); *H04L 47/806* (2013.01); *H04L 49/201* (2013.01); *H04N 21/4622* (2013.01); *H04W 24/10* (2013.01); *H04W 36/0083* (2013.01); *H04W 36/0085* (2018.08); *H04W 48/10* (2013.01); *H04W 48/16* (2013.01); *H04W 56/001* (2013.01); *H04W 56/0005* (2013.01); *H04W 72/005* (2013.01); *H04L 12/1845* (2013.01)

(58) Field of Classification Search
CPC ..... Y02D 10/22; H04L 12/5695; H04L 47/78; H04L 47/821; H04L 12/1845; H04L 47/806; H04L 49/201; H04W 72/04
See application file for complete search history.

(56) References Cited

U.S. PATENT DOCUMENTS 10,530,544 B2 *  1/2020  Jung ...................... H04L 5/0048
2014/0169310 A1 *  6/2014  Ma ........................ H04W 56/001
                                                                370/329
(Continued)

*Primary Examiner* — Salvador E Rivas
(74) *Attorney, Agent, or Firm* — Loppnow & Chapa

(57) ABSTRACT

A method and apparatus include receiving a measurement configuration by higher layer signaling, where the higher layer signaling is above the physical layer. The measurement configuration includes at least information of frequency location of synchronization signals, a carrier frequency, and a maximum allowed measurement bandwidth. A measurement reference signal is then received based on the received measurement configuration, and a measurement based on the received measurement reference signal is performed.

22 Claims, 6 Drawing Sheets

Related U.S. Application Data

(60) Provisional application No. 62/374,606, filed on Aug. 12, 2016.

(51) Int. Cl.
    *H04H 60/43*     (2008.01)
    *H04N 21/462*     (2011.01)
    *H04L 12/931*     (2013.01)
    *H04L 12/927*     (2013.01)
    *H04W 56/00*     (2009.01)
    *H04W 72/00*     (2009.01)
    *H04L 7/10*     (2006.01)
    *H04W 24/10*     (2009.01)
    *H04W 48/10*     (2009.01)
    *H04W 48/16*     (2009.01)
    *H04L 12/18*     (2006.01)

(56) References Cited

U.S. PATENT DOCUMENTS

2017/0325260 A1* 11/2017 Guo .................. H04W 72/0453
2017/0332283 A1* 11/2017 Kubota ............. H04W 36/0058

* cited by examiner

| SYSTEM BANDWIDTH (MHz) | 5 | 10 | 15 | 20 |
|---|---|---|---|---|
| NUMBER OF SUBCARRIERS* | 300 | 600 | 900 | 1200 |
| SUBCARRIER INDICES CORRESPONDING TO 100KHZ FREQUENCY RASTER* | 11, 31, [51, 71, 91, 151, 131, 151, 171, 191, 211, 231, 251] 271, 291 | 1 21 [41 61 81 101 121 141 161 181 201 221 241 261 281 301 321 341 361 381 401 421 441 461 481 501 521 541 561] 581 601 | 11 31 [51 71 91 111 131 151 171 191 211 231 251 271 291 311 331 351 371 391 411 431 451 471 491 511 531 551 571 591 611 631 651 671 691 711 731 751 771 791 811 831 851] 871 891 | 1 21 [41 61 81 101 121 141 161 181 201 221 241 261 281 301 321 341 361 381 401 421 441 461 481 501 521 541 561 581 601 621 641 661 681 701 721 741 761 781 801 881 901 921 941 961 981 1001 1021 1041 1061 1081 1101 1121 1141 1161] 1181 1201 |
| NUMBER OF POSSIBLE PSS/SSS LOCATIONS IN FREQUENCY (N) | 11 | 27 | 41 | 57 |

FIG. 3

```
-- ASN1START

MasterInformationBlock ::=          SEQUENCE {
    dl-Bandwidth                        ENUMERATED {
                                            n30, n60, n90, n120} ,
    systemFrameNumber                   BIT STRING (SIZE (8)) ,
    IndexForSynchSignalLocation         INTEGER (0..56) ,
    numberOfAntennaPorts                BIT STRING (SIZE (5))
}

-- ASN1STOP
```

METHOD AND APPARATUS FOR RECEIVING REFERENCE SIGNALS IN SUPPORT OF FLEXIBLE RADIO COMMUNICATION

FIELD OF THE APPLICATION

The present application relates generally to a method and apparatus for receiving reference signals in support of flexible radio communication in a communication network, and more particularly, to managing a multilevel approach for receiving reference signals, such as for cell detection, in support of an initial unconnected or an already connected state relative to the network.

BACKGROUND

Presently, user equipment (UE), such as wireless communication devices, communicate with other communication devices using wireless signals, such as within a network environment that can include one or more cells within which various communication connections with the network and other devices operating within the network can be supported. Network environments often involve one or more sets of standards, which each define various aspects of any communication connection being made when using the corresponding standard within the network environment. As new standards, such as new radio access technology (NR), are being developed to support additional or extended capabilities through the development of a different set of operating parameters, the present inventors have recognized that dynamic coexistence between the new standard and any preexisting standards, such as Long Term Evolution (LTE), Universal Mobile Telecommunications Service (UMTS), Global System for Mobile Communication (GSM), and/or Enhanced Data GSM Environment (EDGE), could be considered in support of a progressive migration. This can include instances where the different standards are intended to operate with overlapping bandwidths in the same block of spectrum.

For example, in LTE, synchronization signals are transmitted within the center 6 physical resource blocks (PRBs) of a transmission channel bandwidth, where a PRB consists of 12 subcarriers. While this can make it easier to locate and identify the synchronization signals, restricting the location of the synchronization signals in a predetermined way with this level of specificity can make the system less flexible in terms of introducing a new type of service, which might otherwise beneficially employ different forms, such as forms that can incorporate different numerology sets. Strict adherence to a specific detailed and predefined signaling structure can make a system less flexible in terms of avoiding strong interference to a primary synchronization signal and/or a secondary synchronization signal. Furthermore, this can make a system less flexible in terms of enabling shared spectrum access with other radio access technologies.

The present inventors have recognized that a multilevel approach for receiving reference signals can be used to allow a more flexible approach for cell detection as part of initiating a communication connection and/or maintaining an ongoing communication connection with a network. Such a flexible multilevel approach can further be used to support dynamic coexistence between multiple types of communications in accordance with both new and legacy communication standards for a more progressive migration to newer communication standards.

SUMMARY

Presently, user equipment, such as wireless communication devices, communicate with other communication devices using wireless signals. According to a possible embodiment, a user equipment can receive a measurement configuration by higher layer signaling within a communication network, where the higher layer signaling is above the physical layer. The measurement configuration includes at least information of frequency location of synchronization signals, a carrier frequency, and a maximum allowed measurement bandwidth. The user equipment can receive a measurement reference signal based on the received measurement configuration. The user equipment can then perform a measurement based on the received measurement reference signal.

According to another possible embodiment, a user equipment can include a controller, which can manage the operation of the user equipment including the operation of a transceiver that can receive a measurement configuration by higher layer signaling, where the higher layer signaling is above the physical layer, and a measurement reference signal based on the received measurement configuration, wherein the measurement configuration includes at least information of frequency location of synchronization signals, a carrier frequency, and a maximum allowed measurement bandwidth.

According to another possible embodiment, a communication network can send a measurement configuration by higher layer signaling, where the higher layer signaling is above the physical layer. The measurement configuration can include at least information of frequency location of synchronization signals, a carrier frequency, and a maximum allowed measurement bandwidth. The communication network can send a measurement reference signal based on the sent measurement configuration, which upon receipt by a user equipment can be used by the user equipment to perform a measurement based on the received measurement reference signal.

According to another possible embodiment, a communication network can include a controller, which can manage the operation of a transceiver that can send a measurement configuration by higher layer signaling, where the higher layer signaling is above the physical layer, and a measurement reference signal based on the sent measurement configuration, wherein the measurement configuration includes at least information of frequency location of synchronization signals, a carrier frequency, and a maximum allowed measurement bandwidth.

These and other objects, features, and advantages of the present application are evident from the following description of one or more preferred embodiments, with reference to the accompanying drawings.

BRIEF DESCRIPTION OF THE DRAWINGS

FIG. 3 is a table of exemplary locations for primary and secondary synchronization signals for different system bandwidths in at least one exemplary network;

DETAILED DESCRIPTION OF THE PREFERRED EMBODIMENT(S)

Figure 1:
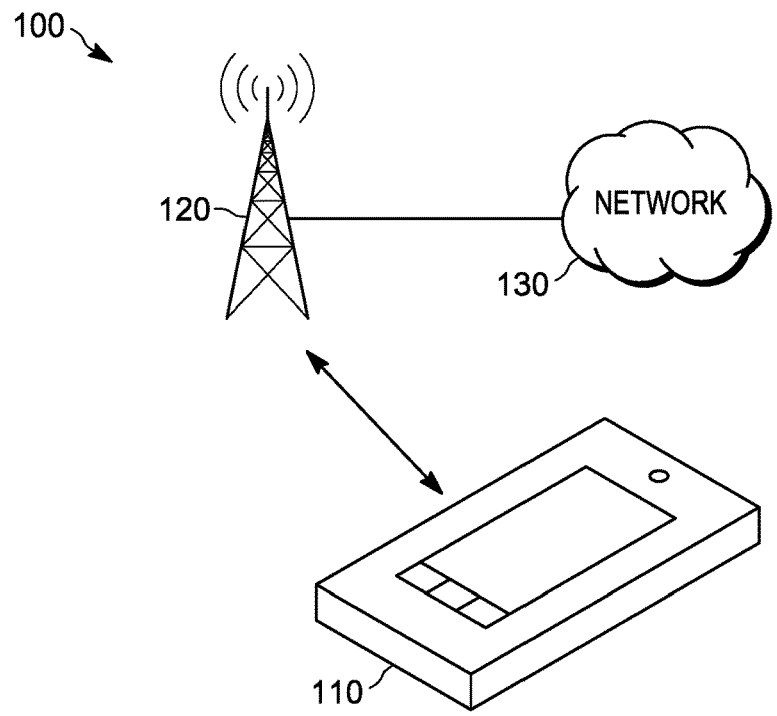
FIG. 1 is a block diagram of an exemplary network environment in which at least some of the present disclosed embodiments can operate.

While the present disclosure is susceptible of embodiment in various forms, there is shown in the drawings and will hereinafter be described presently preferred embodiments with the understanding that the present disclosure is to be considered an exemplification of the invention and is not intended to limit the invention to the specific embodiments illustrated.

Embodiments provide a method and apparatus for receiving reference signals in support of flexible radio communication including cell detection within a flexible radio communication system.

FIG. 1 is an example block diagram of a system 100 according to a possible embodiment. The system 100 can include a wireless communication device 110, such as User Equipment (UE), a base station 120, such as an enhanced NodeB (eNB) or next generation NodeB (gNB), and a network 130. The wireless communication device 110 can be a wireless terminal, a portable wireless communication device, a smartphone, a cellular telephone, a flip phone, a personal digital assistant, a personal computer, a selective call receiver, a tablet computer, a laptop computer, or any other device that is capable of sending and receiving communication signals on a wireless network.

The network 130 can include any type of network that is capable of sending and receiving wireless communication signals. For example, the network 130 can include a wireless communication network, a cellular telephone network, a Time Division Multiple Access (TDMA)-based network, a Code Division Multiple Access (CDMA)-based network, an Orthogonal Frequency Division Multiple Access (OFDMA)-based network, a Long Term Evolution (LTE) network, a 5$^{th}$ generation (5G) network, a 3rd Generation Partnership Project (3GPP)-based network, a satellite communications network, a high altitude platform network, the Internet, and/or other communications networks.

Figure 2:
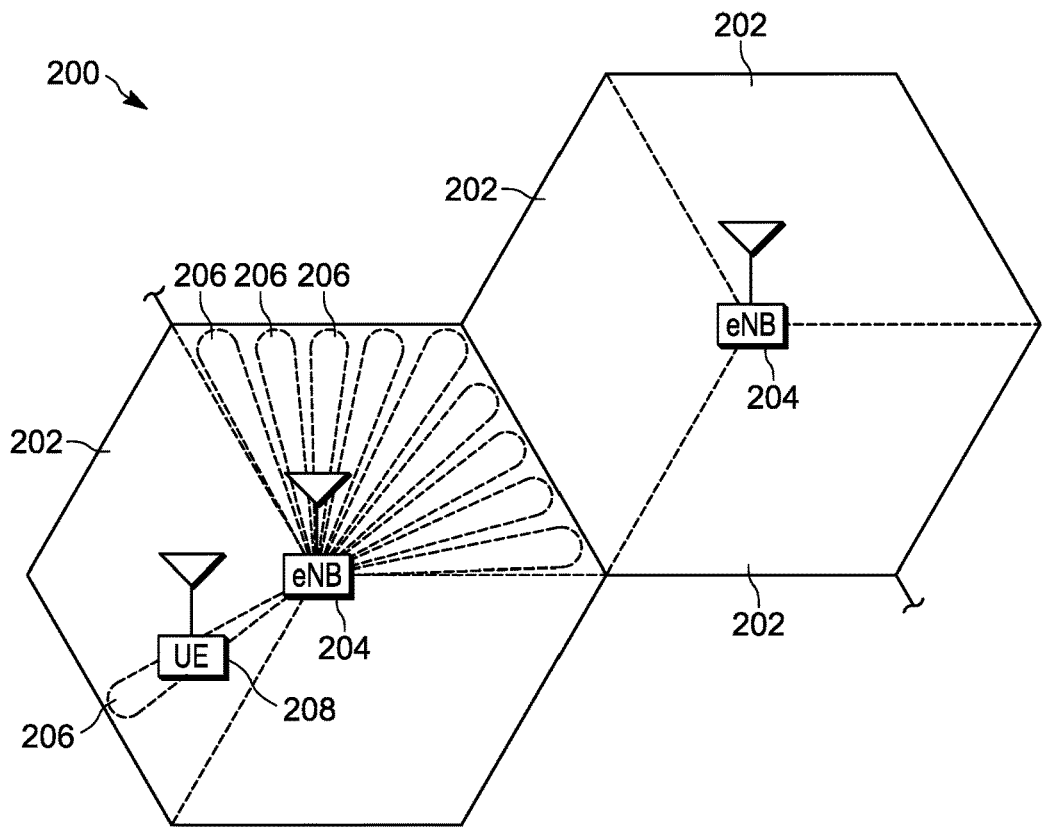
FIG. 2 is an overview of multiple communication regions in an exemplary cellular communication system.

In at least some instances, the network will provide coverage across a geographical area, where in at least some instances, the area of coverage will be divided into multiple regions, at least sometimes referred to as cells. FIG. 2 is an overview of multiple communication regions 202 in an exemplary cellular communication system 200. In many cellular communication networks, each of the multiple communication regions is often associated with a particular base station 204. In some cases, more than one base station can support a particular communication area, such as in edge areas where regions may overlap. In some cases, a particular base station can support one or more communication regions. In the illustrated embodiment, each particular base station 204 can support at least three regions 202, where the base station is positioned at a shared vertex of each of the three regions.

Still further, at least some of the regions 202 can be further subdivided into multiple still smaller regions, using one or more narrow beams 206. An example of the further subdivision of at least one of the regions 202 is shown. Another example highlights the possibility that a more focused beam could be directed to coincide with the location of a user equipment 208. The user equipment 208 could similarly communicate with the base station 204 via a similarly more focused beam with same or different beamwidth. In order to enable greater flexibility in the formation of communication regions having varying sizes and shapes, the base station and the user equipment can employ antenna arrays, having multiple radiating and reception elements, that together can be employed to create various transmission and reception profiles or beamforming patterns. The corresponding size and shape of the different regions can often have an impact on the ability of the network to reuse frequencies while supporting communication connections between the various wireless communication devices located throughout the coverage area.

As noted previously, the present inventors have recognized that in supporting cell detection in a new radio access technology, that any dynamic coexistence between the new radio access technology and any preexisting should be taken into account in order to support a more progressive migration. In addition to taking into account the possibility of dynamic coexistence, it may be desirable for the network to configure multiple numerology sets in a given carrier to provide scheduling flexibility (e.g., supporting hybrid analog-digital or analog beamforming with more number of symbols), to serve various user equipment with different speeds and/or to satisfy different service requirements (e.g., low latency, unlicensed band operation), and flexible time-frequency resource allocation of different numerologies. A numerology comprises one or more of an OFDM/SC-FDMA subcarrier spacing, a cyclic prefix length, number of symbols comprising a slot, time-frequency portion bandwidth etc. Different numerology sets may differ in one or more of parameters or characteristics of a numerology. Although the cell might be able to configure multiple time-frequency portions using different numerologies, it may be possible for synchronization signals transmitted with a baseline (or reference) numerology to be shared by all numerology configurations. A baseline or reference numerology may be dependent on the carrier band such as reference numerology of 15 kHz OFDM/SC-FDMA subcarrier spacing for low carrier frequency band (such as below 6 GHz e.g., 2 GHz) and reference numerology of 120 kHz OFDM/SC-FDMA subcarrier spacing for high carrier frequency band (such as above 6 GHz, e.g., 28 GHz).

It also may be possible for cell detection in high frequency bands to take into account beamforming operation and/or repetition to obtain a proper coverage. Furthermore, in order to increase the area traffic capacity, dense transmission and reception point (TRP) deployment may be needed. The dense deployment is likely to require an increased number of supportable cell identities (IDs).

According to at least one embodiment, it is possible to increases the number of supportable cell IDs without increasing detection hypotheses by configuring multiple primary synchronization signal (PSS)/secondary synchronization signal (SSS) resources, where a cell ID is derived from combination of a PSS/SSS time-frequency resource, a PSS index, and a SSS index.

Flexibly placing synchronization signals in time-frequency radio resources is beneficial for dynamic coexistence between the new radio access technology (RAT) and legacy RATs, deployment in unlicensed spectrum bands, and flexible configuration of multiple numerology sets within a carrier.

Two step measurement procedures are employed to provide necessary flexibility on system configuration (e.g. number of operating beams) and yet to keep cell detection complexity low: first, narrow band measurement without beam differentiation and physical broadcast channel (PBCH) decoding for candidate cells, and secondly, wideband beam measurement according to the indicated system configuration.

Multiple possible locations for PSS/SSS transmission are defined, and a cell ID is determined by combination of PSS/SSS and PSS/SSS location. In this way, a larger number of cell IDs are supported, without increasing the number of sequences for synchronization signals. For deployment scenarios with strong co-channel interference, such as macro-to-pico inter-cell interference, strong interference on synchronization signals can be avoided by coordinating PSS/SSS frequency resources among neighbor cells. Since the new possible locations for PSS/SSS transmission are aligned with frequency raster, cell detection complexity in the proposed scheme can be comparable to LTE cell detection, if PSS/SSS of neighbor cells are transmitted on the same radio resource.

Figures 4, 5:
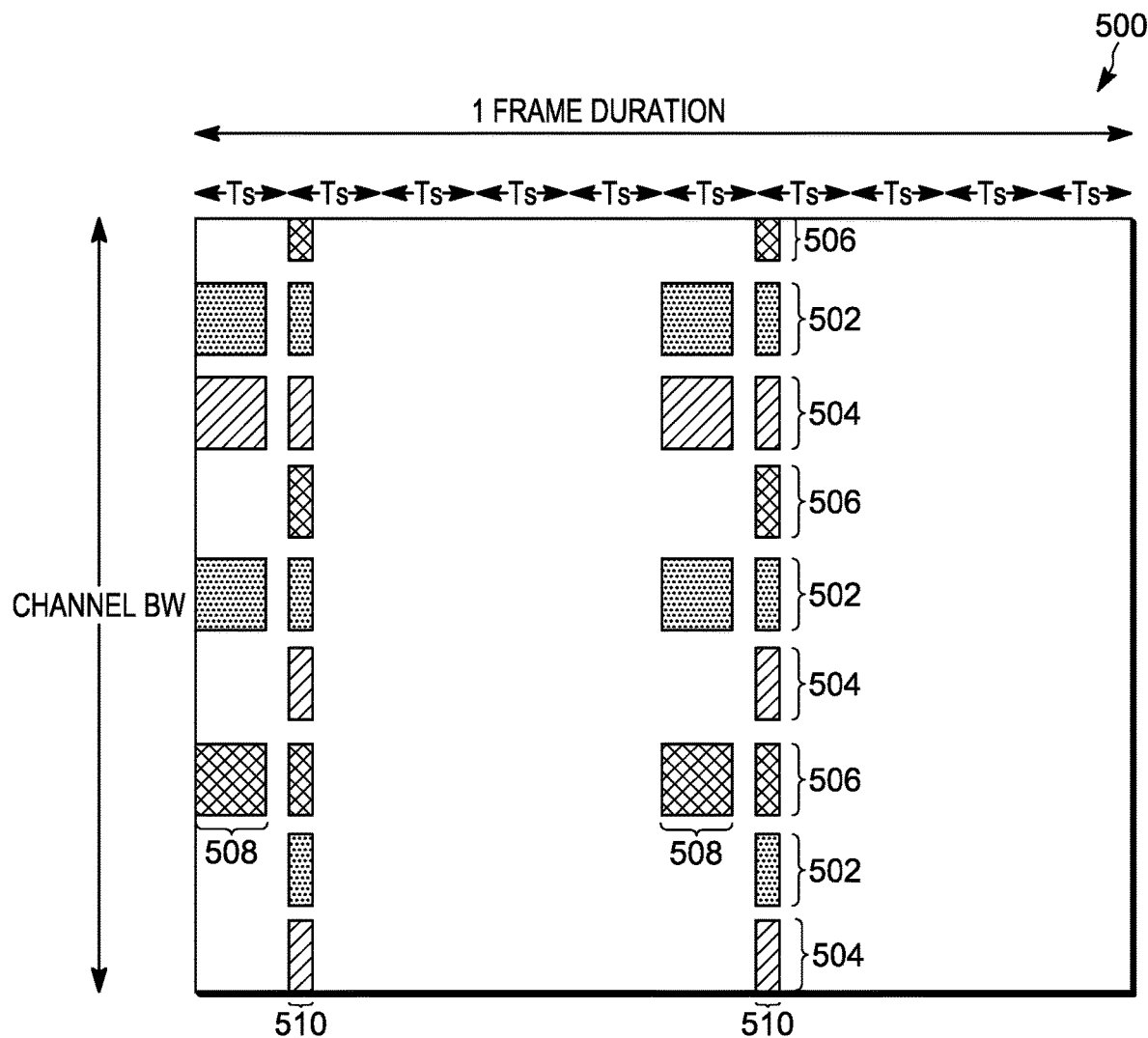
FIG. 4 is an example of information elements for a master information block.
FIG. 5 is an example allocation in an exemplary frame across an available channel bandwidth of primary synchronization signal (PSS)/secondary synchronization signal (SSS), sub-band measurement reference signal (MRS), physical broadcast channel (PBCH) and wideband measurement reference signal (MRS) for at least three cells.

PSS/SSS, sub-band mobility measurement reference signals (MRS), and physical broadcast channel (PBCH) carrying a master information block (MIB) message are transmitted on the same sub-band, for example a subset of available subcarriers, and relative timing of MRS and PBCH with respect to PSS/SSS are pre-configured and known to both UE and transmission and reception point (TRP). For cell detection, UE can perform the following steps:
  1. Perform frequency scanning over frequency raster.
  2. Detect PSS/SSS on one or more frequencies, and identify a partial cell ID from each detected PSS/SSS.
    a. Such as, partial cell ID=$3*I_{SSS}+I_{PSS}$, where $I_{PSS}$ (=0, 1, 2) is a PSS index and $I_{SSS}$ (=0, 1, . . . , 167 for example) is an SSS index.
  3. Based on the identified partial cell ID, a UE can determine sub-band measurement reference signal (MRS) resources, for example a set of resource elements within the sub-band, and performs sub-band mobility measurement.
    a. At this point, a UE does not necessarily have knowledge on the number of TRP transmit (Tx) beams or the number of simultaneous beams, for example, corresponding to different antenna sub-arrays and/or polarization or the number of transmit and receive units (TXRU). Instead, a UE simply measures the total (or average) reference signal received power (RSRP) without distinguishing different Tx beams of TRP, and decides whether or not to decode PBCH by ranking RSRP measurements and/or comparing the RSRP measurements with a threshold RSRP value. For example, a UE may decode PBCHs for the cells with the two highest RSRP measurements whose RSRP values are above the threshold RSRP value. Sub-band MRS may also be used for PBCH decoding, if sub-band MRS and PBCH are transmitted with the same set of Tx beams, that is, a UE can assume the same precoding/beamforming is used for sub-band MRS and PBCH.
  4. A UE can obtain information on frequency location of PSS/SSS within the system bandwidth via PBCH decoding, and identify a full cell ID.
    a. Subcarrier indices corresponding to frequency raster can be predetermined for a given frequency raster value, such as 100 KHz, as shown in FIG. 3. Among them, possible locations for PSS/SSS transmission within the system bandwidth can be determined, based on the number of subcarriers which PSS/SSS occupy. The possible locations may be further downselected to reduce the number of signaling bits in a master information block (MIB). The set of subcarrier indices corresponding to the selected frequency raster (for example, center of PSS/SSS transmission or offset of the PSS/SSS in terms of number of resource blocks or number of subcarriers) for a given system bandwidth may be known to both UE and TRP. A resource block comprises a plurality of subcarriers such as 12 subcarriers. In the example shown in FIG. 3, the maximum number of possible locations (center of PSS/SSS transmission) is 57, where a subcarrier spacing is assumed to be 15 KHz, and subcarrier indices which can be center of PSS/SSS transmission include all of the identified subcarrier indices included between the brackets, which excludes the first two and the last two indices in each of the respective lists, assuming that PSS/SSS, sub-band MRS, and PBCH are transmitted within 70 consecutive subcarriers. With a maximum number of 57 locations, in such an example, 6 bits in the MIB can indicate all the possible locations for all the supported system bandwidths.
    b. In one embodiment, the full cell ID can be determined as follows:
      i. Cell ID=$(S_I)\mod(x)*504+3*I_{SSS}+I_{PSS}$, where $S_I$ is an index for the set of subcarrier indices corresponding to possible PSS/SSS center locations, with $S_I$=0, 1, 2, . . . , N−1 (N: the number of possible PSS/SSS locations for a given system bandwidth), and x is an integer such as 1 or 4.
      ii. In high frequency bands, a given cell may transmit PSS/SSS, sub-band MRS, and PBCH on multiple locations with same or different sets of Tx beams. For example, a UE as part of its cell detection hypothesis can combine received PSS/SSS on resources which may result in same system ID (e.g. 4 resources SI=0, 4, 8, 12), for detection.
    c. In FIG. 4, examplary information elements (IEs) for a MIB are shown. The IE 'dl-Bandwidth' indicates the system bandwidth in terms of the number of PRBs, where each PRB consists of 10 subcarriers. The IE 'IndexForSynchSignalLocation' represents an index for the selected PSS/SSS location. A UE can identify the subcarrier index corresponding to the center of PSS/SSS transmission from two IEs, 'dl-Bandwidth' and 'IndexForSynchSignalLocation'. In the UE memory, a UE may store only the lowest subcarrier index ($K_{min}$) among all the possible PSS/SSS center locations for each system bandwidth, and may identify the subcarrier index for the center of PSS/SSS transmission as follows:

$$K_{min}+S_I*20$$

5. A UE obtains information on wideband beam measurement configuration from PBCH decoding and performs wideband beam measurement.

a. An MIB may carry information on the number of antenna ports of wideband MRS.
b. A Wideband MRS location is determined by the signaled $S_f$, 'IndexForSynchSignalLocation', such that wideband MRS are transmitted on all the sub-bands which can result in the same system ID as $S_f$. For example, if $(S_f) \bmod(x)=0$, $x=4$, then wideband MRS are transmitted for locations corresponding to $S_f=0, 4, 8, 12, \ldots$. Wideband MRS may occupy the resource partially in each sub-band.
c. In one embodiment, sub-band MRS is a part of wideband MRS.

According to a further embodiment, such as for connected mode UEs, the measurement configuration may include frequency information when the synchronization signals are transmitted, such as the information element (IE) 'IndexForSynchSignalLocation', carrier frequency information, and bandwidth information, for example maximum allowed measurement bandwidth. Furthermore, the wideband beam measurement configuration, such as the information element (IE) 'maxNumberOfAntennaPorts' corresponding to the maximum number of antenna ports for the wideband MRS, can be signaled.

The UE can identify cell ID from PSS/SSS detection and frequency information of PSS/SSS indicated in the measurement configuration. Thus, the connected mode UE does not need to decode PBCH to obtain a full cell ID.

FIG. 5 illustrates an example allocation in an exemplary frame 500 across an available channel bandwidth of primary synchronization signal (PSS)/secondary synchronization signal (SSS), sub-band measurement reference signal (MRS), physical broadcast channel (PBCH) and wideband measurement reference signal (MRS) for at least three cells. In the illustrated embodiment, the gray areas 502 correspond to allocations associated with cell 1, the areas 504 highlighted by ascending diagonal lines correspond to allocations associated with cell 2, and the areas 506 highlighted by cross hatching correspond to allocations associated with cell 3. Furthermore, the more square shaped allocations 508 in each instance represents a proposed allocation for PSS/SSS, sub-band MRS, and PBCH. The vertical rectangle shaped allocations 510 in each instance represents a proposed allocation for wideband MRS for each of the respective cells. Each interval identified by the symbol, $T_S$, represents a single subframe duration.

Figure 6:
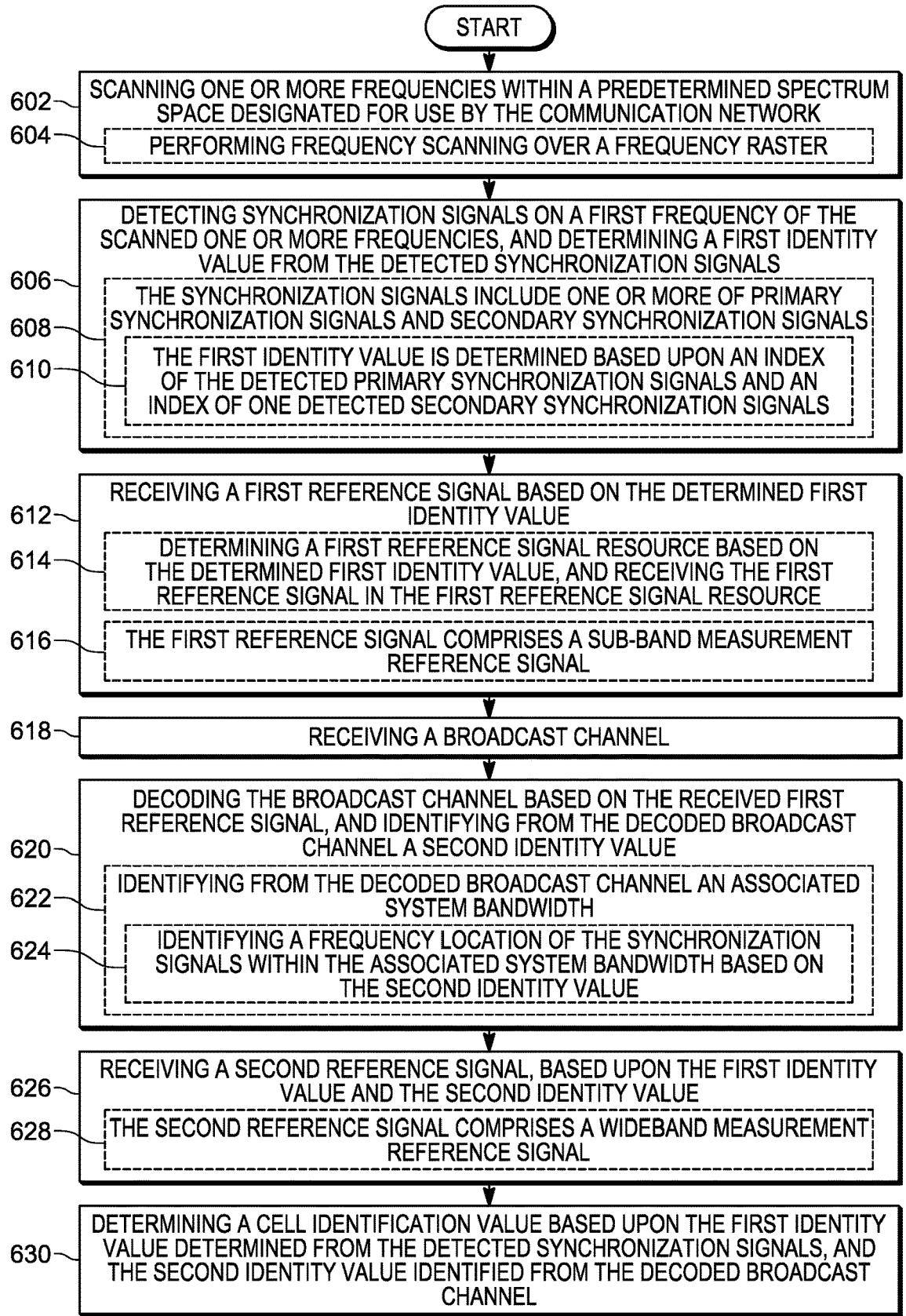
FIG. 6 is a flow diagram for receiving reference signals in support of flexible radio communication in a communication network, in accordance with at least one embodiment.

FIG. 6 illustrates a flow diagram 600 for receiving reference signals in support of flexible radio communication in a communication network, in accordance with at least one embodiment. The flow diagram illustrates the operation of a wireless communication device, such as the UE 110, according to at least one possible embodiment. At 602, one or more frequencies within a predetermined spectrum space designated for use by the communication network is scanned. In some instances, performing 604 a scanning of one or more frequencies within a predetermined spectrum space can include performing frequency scanning over a frequency raster.

Synchronization signals on a first frequency of the scanned one or more frequencies is detected 606, and a determination is made of a first identity value from the detected synchronization signals. In at least some instances, the synchronization signals can include one or more of primary synchronization signals and secondary synchronization signals 608. In some of these instances, the first identity value can be determined based upon an index of the detected primary synchronization signals and an index of the detected secondary synchronization signals 610.

A first reference signal is received 612, based on the determined first identity value. In at least some instances, a first reference signal resource can be determined 614, based on the determined first identity value, and the first reference signal can be received in the first reference signal resource. In at least some instances, the first reference signal can comprise a sub-band measurement reference signal 616.

In some instances, a first mobility measurement can be performed using the first reference signal. In such an instance, based upon the first mobility measurement, a determination can be made as to whether to decode the broadcast channel, where the broadcast channel can be a physical broadcast channel.

At step 618, a broadcast channel is received. The broadcast channel is then decoded based upon the received first reference signal, and a second identity value is identified from the decoded broadcast channel 620. In at least some instances, an associated system bandwidth can be identified 622 from the decoded broadcast channel. In some of these instances, a frequency location of the synchronization signals within the associated system bandwidth can be identified 624, based on the second identity value.

A second reference signal is then received 626, based upon the first identity value and the second identity value. In at least some instances, the second reference signal can include a wideband measurement reference signal 628.

In some instances, it can be further possible to determine an indication of a number of antenna ports in the second reference signal, based upon the decoded broadcast channel. In such an instance, a second mobility measurement can be performed using the second reference signal for at least one antenna port of the determined number of antenna ports.

Still further in some instances, a cell identification value can be determined, based upon the first identity value determined from the detected synchronization signals, and the second identity value identified from the decoded broadcast channel 630.

The manner of receiving a first reference signal based on a determined first identity value, in at least some instances can be consistent with a base line numerology that may be shared by all numerology configurations including numerologies that may be consistent with another and/or multiple standards. In turn this may allow a broadcast channel to be received through which a second reference signal can be received based on a determined second identity value. By receiving a second reference signal a still further resolving of a cell identity may be possible, including instances where the further cell identity may take into account a beamforming operation and/or repetition to obtain proper coverage.

Figure 7:
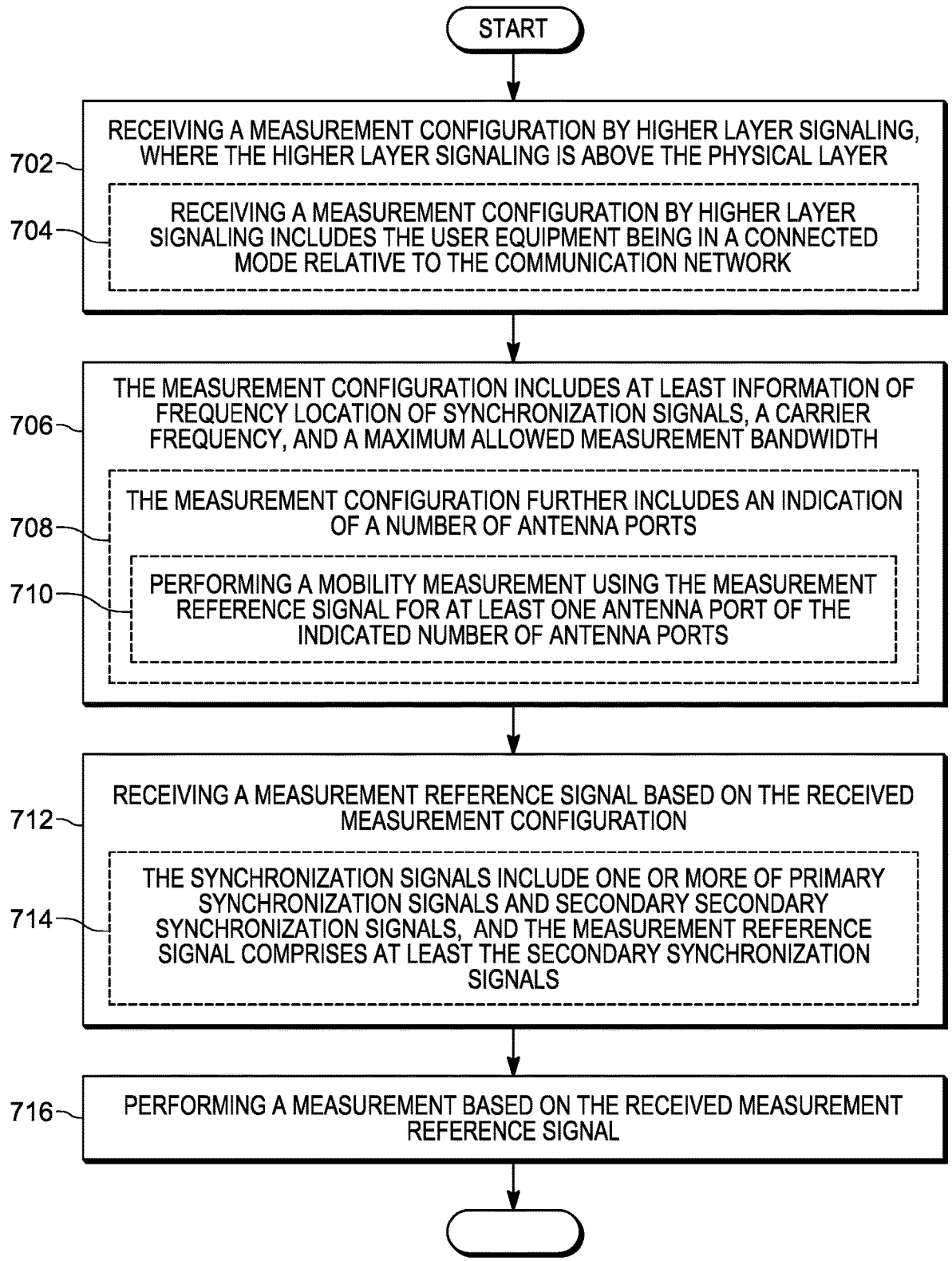
FIG. 7 is a flow diagram for receiving reference signals in support of flexible radio communication in a communication network, in accordance with at least one embodiment.

FIG. 7 illustrates a flow diagram 700 for receiving reference signals in support of flexible radio communication in a communication network, in accordance with at least one embodiment. The flow diagram illustrates the operation of a wireless communication device, such as the UE 110, according to at least one possible embodiment. At 702, a measurement configuration is received through higher layer signaling, where the higher layer signaling is above the physical layer. In at least some instances, receiving a measurement configuration through higher layer signaling can include the user equipment being in a connected mode relative to the communication network 704.

The measurement configuration can include at least information of frequency location of synchronization signals, a carrier frequency, and a maximum allowed measurement bandwidth 706. In at least some instances, the measurement configuration can further include an indication of a number of antenna ports 708, where in at least some of these instances, a mobility measurement can be performed 710 using the measurement reference signal for at least one antenna port of the indicated number of antenna ports.

At 712, a measurement reference signal is then received 712 based on the received measurement configuration. In at least some instances, the synchronization signals can include one or more of primary synchronization signals and secondary synchronization signals, and the measurement reference signal can include at least the secondary synchronization signals 714. A measurement, such as a mobility measurement, can be performed 716, based on the received measurement reference signal.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. Also, some of the steps performed can be repeated on an ongoing or continuous basis simultaneously while other steps are performed. Furthermore, different steps can be performed by different elements or in a single element of the disclosed embodiments.

Figure 8:
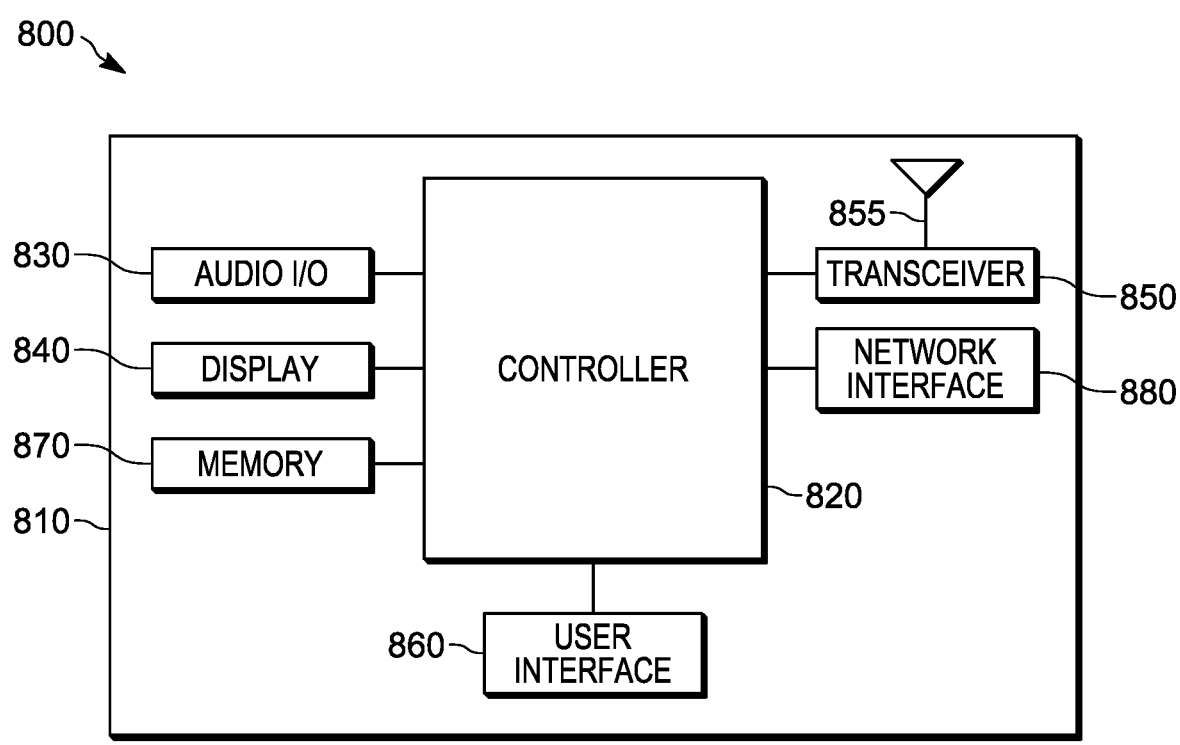
FIG. 8 is an example block diagram of an apparatus according to a possible embodiment.

FIG. 8 is an example block diagram of an apparatus 800, such as the wireless communication device 110, according to a possible embodiment. The apparatus 800 can include a housing 810, a controller 820 within the housing 810, audio input and output circuitry 830 coupled to the controller 820, a display 840 coupled to the controller 820, a transceiver 850 coupled to the controller 820, an antenna 855 coupled to the transceiver 850, a user interface 860 coupled to the controller 820, a memory 870 coupled to the controller 820, and a network interface 880 coupled to the controller 820. The apparatus 800 can perform the methods described in all the embodiments The display 840 can be a viewfinder, a liquid crystal display (LCD), a light emitting diode (LED) display, a plasma display, a projection display, a touch screen, or any other device that displays information. The transceiver 850 can include a transmitter and/or a receiver. The audio input and output circuitry 830 can include a microphone, a speaker, a transducer, or any other audio input and output circuitry. The user interface 860 can include a keypad, a keyboard, buttons, a touch pad, a joystick, a touch screen display, another additional display, or any other device useful for providing an interface between a user and an electronic device. The network interface 880 can be a Universal Serial Bus (USB) port, an Ethernet port, an infrared transmitter/receiver, an IEEE 1394 port, a WLAN transceiver, or any other interface that can connect an apparatus to a network, device, or computer and that can transmit and receive data communication signals. The memory 870 can include a random access memory, a read only memory, an optical memory, a solid state memory, a flash memory, a removable memory, a hard drive, a cache, or any other memory that can be coupled to an apparatus.

The apparatus 800 or the controller 820 may implement any operating system, such as Microsoft Windows®, UNIX®, or LINUX®, Android™, or any other operating system. Apparatus operation software may be written in any programming language, such as C, C++, Java or Visual Basic, for example. Apparatus software may also run on an application framework, such as, for example, a Java® framework, a .NET® framework, or any other application framework. The software and/or the operating system may be stored in the memory 870 or elsewhere on the apparatus 800. The apparatus 800 or the controller 820 may also use hardware to implement disclosed operations. For example, the controller 820 may be any programmable processor. Disclosed embodiments may also be implemented on a general-purpose or a special purpose computer, a programmed microprocessor or microprocessor, peripheral integrated circuit elements, an application-specific integrated circuit or other integrated circuits, hardware/electronic logic circuits, such as a discrete element circuit, a programmable logic device, such as a programmable logic array, field programmable gate-array, or the like. In general, the controller 820 may be any controller or processor device or devices capable of operating an apparatus and implementing the disclosed embodiments. Some or all of the additional elements of the apparatus 800 can also perform some or all of the operations of the disclosed embodiments.

The method of this disclosure can be implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

What is claimed is:

1. A method in a communication network including at least a first base station, the method comprising:
   determining for use with a user equipment a measurement configuration, which includes at least information on a frequency location of synchronization signals, a carrier frequency value, and a measurement bandwidth;
   transmitting the measurement configuration to the user equipment by higher layer signaling, where the higher layer signaling is above the physical layer;
   transmitting one or more synchronization signals on the frequency location, from which a first identity value can be determined;
   transmitting to the user equipment a broadcast channel from which a second identity value can be determined, the broadcast channel including a first reference signal based on the first identity value; and
   transmitting a second reference signal based on the first identity value, the second identity value, the frequency location of synchronization signals, the carrier frequency value, and the measurement bandwidth.

2. A method in accordance with claim 1, wherein the second identity value is determinable by decoding the broadcast channel based on the first reference signal.

3. A method in accordance with claim 1, wherein the second reference signal is a mobility measurement reference signal, and the performed measurement is a mobility measurement.

4. A method in accordance with claim 1, wherein a first reference signal resource is determinable based on the first identity value, and the first reference signal can be received in the first reference signal resource.

5. A method in accordance with claim 1, wherein a second reference signal resource is determinable based on the first identity value, the second identity value, the carrier frequency value, and the measurement bandwidth, and the second reference signal can be received in the second reference signal resource.

6. A method in accordance with claim 1, wherein the frequency location of synchronization signals included in the measurement configuration is a frequency value in a frequency raster.

7. A method in accordance with claim 1, wherein the synchronization signals include one or more of primary synchronization signals and secondary synchronization signals.

8. A method in accordance with claim 7, wherein the first identity value is determinable, based upon an index of the detected primary synchronization signals and an index of the detected secondary synchronization signals.

9. A method in accordance with claim 1, wherein the first reference signal comprises a sub-band reference signal.

10. A method in accordance with claim 1, wherein the second reference signal comprises a wideband reference signal.

11. A method in accordance with claim 1, wherein the broadcast channel is a physical broadcast channel.

12. A method in accordance with claim 1, further comprising transmitting an indication of a number of antenna ports for the second reference signal.

13. A method in accordance with claim 12, wherein the measurement uses the second reference signal for at least one antenna port of the indicated number of antenna ports.

14. A method in accordance with claim 1, wherein transmitting a measurement configuration by higher layer signaling includes transmitting the measurement configuration to the user equipment being in a connected mode relative to the communication network.

15. A method in accordance with claim 1, wherein the communication network further includes a second base station, where the measurement configuration is transmitted by the first base station, and the one or more synchronization signals, the broadcast channel and the second reference signal are transmitted by the second base station.

16. A network entity in a communication network, the network entity comprising:
   a controller that determines for use with a user equipment a measurement configuration, which includes at least information on a frequency location of synchronization signals, a carrier frequency value, and a measurement bandwidth; and
   a transceiver that transmits the measurement configuration to the user equipment by higher layer signaling, where the higher layer signaling is above the physical layer;
   wherein one or more synchronization signals on the frequency location are transmitted, from which a first identity value can be determined;
   wherein a broadcast channel is transmitted to the user equipment from which a second identity value can be determined, the broadcast channel including a first reference signal based on the first identity value; and
   wherein a second reference signal is transmitted, the second reference signal being based on the first identity value, the second identity value, the frequency location of synchronization signals, the carrier frequency value, and the measurement bandwidth.

17. A network entity in accordance with claim 16, wherein the second identity value is determinable by decoding the broadcast channel based on the first reference signal.

18. A network entity in accordance with claim 16, wherein the second reference signal is a mobility measurement reference signal, and the performed measurement is a mobility measurement.

19. A network entity in accordance with claim 16, wherein a first reference signal resource is determinable based on the first identity value; and the first reference signal can be received in the first reference signal resource.

20. A network entity in accordance with claim 16, wherein a second reference signal resource is determinable based on the first identity value, the second identity value, the carrier frequency value, and the measurement bandwidth, and the second reference signal can be received in the second reference signal resource.

21. A network entity in accordance with claim 16, wherein the frequency location of synchronization signals included in the measurement configuration is a frequency value in a frequency raster.

22. A network entity in accordance with claim 16, wherein the communication network further includes an additional network entity, where the one or more synchronization signals, the broadcast channel and the second reference signal are transmitted by the additional network entity.

* * * * *